(12) United States Patent
Skala et al.

(10) Patent No.: US 6,355,969 B1
(45) Date of Patent: Mar. 12, 2002

(54) PROGRAMMABLE INTEGRATED CIRCUIT STRUCTURES AND METHODS FOR MAKING THE SAME

(75) Inventors: Stephen L. Skala; Subhas Bothra, both of Fremont, CA (US)

(73) Assignee: Philips Electronics North America Corporation, New York, NY (US)

( * ) Notice: Subject to any disclaimer, the term of this patent is extended or adjusted under 35 U.S.C. 154(b) by 0 days.

(21) Appl. No.: 09/405,043

(22) Filed: Sep. 27, 1999

(51) Int. Cl.[7] ............................................. H01L 21/44
(52) U.S. Cl. ....................................... 257/530; 257/758
(58) Field of Search ........................... 257/48, 211, 758, 257/530; 438/131, 600, 637, 640

(56) References Cited

U.S. PATENT DOCUMENTS

| | | | |
|---|---|---|---|
| 5,117,276 A | * | 5/1992 | Thomas et al. |
| 5,290,734 A | * | 3/1994 | Boardman et al. |
| 5,391,921 A | * | 2/1995 | Kudoh et al. |
| 5,585,288 A | * | 12/1996 | Davis et al. |
| 5,705,940 A | * | 1/1998 | Newman et al. |
| 5,712,510 A | * | 1/1998 | Bui et al. |
| 5,949,127 A | * | 9/1999 | Lien et al. |
| 5,949,143 A | * | 9/1999 | Bang |
| 6,054,334 A | * | 4/2000 | Ma |
| 6,211,561 B1 | * | 4/2001 | Zhao |

OTHER PUBLICATIONS

B.P. Shieh, et al. "Integration and Realiability Issues for Low Capacitance Air–Gap Interconnect Structures", 1998, IEEE, pp. 125–127.*

* cited by examiner

Primary Examiner—George Fourson
Assistant Examiner—Michelle Estrada
(74) Attorney, Agent, or Firm—Martine & Penilla, LLP (57) ABSTRACT

A method for making, and a programmable structure for use in a semiconductor chip is provided. The method includes forming a lower metallization layer, and forming an upper metallization layer. The upper metallization layer has a first portion and a second portion. An eroded via is formed between the lower metallization layer and the first portion of the upper metallization layer, and a conductive via is formed between the lower metallization layer and the second portion of the upper metallization layer. The method then includes applying a current between the lower metallization layer and the second portion of the upper metallization layer. The current is configured to cause electromigration in the lower metallization layer such that some of the electromigration fills the eroded via between the lower metallization layer and first portion of the upper metallization layer. The current, if programming is desired, is applied from pads of the semiconductor chip either directly or by way of a programming circuit.

11 Claims, 7 Drawing Sheets

PROGRAMMABLE INTEGRATED CIRCUIT STRUCTURES AND METHODS FOR MAKING THE SAME

BACKGROUND OF THE INVENTION

1. Field of the Invention

The present invention relates to the programming of devices of semiconductor chips, and more particularly, to the forming of programmable devices and the selective programming of such devices by way of electromigration induced currents.

2. Description of the Related Art

Recently, there have been many advances in the fabrication of semiconductor devices, which have led to the continued development of smaller and smaller semiconductor chips. Due to these advances, miniature chips are finding a number of new applications. Such applications include, for example, automated teller machine (ATM) cards, identification cards, security access cards, set-top boxes, cellular phones, and the like. The integrated chips bring these type of applications substantially more intelligence than was previously possible with magnetic strips and other static data storage. Applications such as these, however, require chips that can be programmed with specific passwords, programs, or codes in order to store information that is either unique to the user, or specific to the chip.

Traditionally, the manufacturer of the chip may be required to program codes or set wiring after the chip is packaged using laser fuse technology or before packaging using antifuse technology. As is well known to those skilled in the art, laser fuse technology requires that a fuse structure (that is in the form of a metal line) be blown apart to prevent future electrical conduction. Although fuse technology is capable of providing programmability, a polysilicon-type fuse (which is most common), necessarily prevents a certain amount of chip area from being used for active circuitry. Typically, fuses that utilize a laser for obliteration need to be placed sufficiently away from active circuitry because of the potential for collateral damage to other circuit elements from the laser pulse or by subsequent damage associated with damage to the passivation and intermetal oxides (IMO) layers at the fuse locations. Additionally, fuses that require laser obliteration need to adhere to specific spacing requirements to ensure that there is no thermal coupling between devices or inadvertent programming of other fuses.

Antifuse technology, on the other hand, defines a link between two metal layers by forming links through an amorphous silicon layer. As can be appreciated, implementing antifuse structures into a custom chip design requires a number of special fabrication operations to make the antifuse structures. In addition, some antifuse structures require even more chip area than fuses. More importantly, the programming of antifuses requires that enough current is passed between two metal layers that a silicided link is created between the selected metal lines. Although antifuse technology can be used, it is also known to be somewhat unreliable. That is, fuses that appear programmed at one point in the chip's operational life may become de-programmed unexpectedly. Most importantly, the fabrication of limited number of antifuse devices onto an application specific integrated circuit (ASIC) may drive the cost of fabrication too high to make the chip practical for certain consumer applications.

In view of the foregoing, there is a need for a method of making a programmable structure, which can be cost effectively fabricated and is capable compactly being designed into any type of integrated circuit structure. There is also a need for programmable structures that do not occupy chip area that needs to be used for active devices and do not cause damage to neighboring devices when programmed.

SUMMARY OF THE INVENTION

Broadly speaking, the present invention fills these needs by providing a programmable structure that can be internally programmed to form a hard-wired link, and methods for making the programmable structure. The internal programming is preferably completed by externally providing programming signals to pads of a semiconductor chip having the programmable structures. It should be appreciated that the present invention can be implemented in numerous ways, including as a process, an apparatus, a system, a device, or a method. Several inventive embodiments of the present invention are described below.

In one embodiment, a programmable structure is disclosed. The programmable structure includes a first lower metallization line that is defined on a first metallization layer. A second lower metallization line is defined on the first metallization layer, and the first and second lower metallization lines are electrically connected. Further included is a first and second upper metallization lines defined on a second metallization layer. A conductively filled via electrically connects the second lower metallization line to the second upper metallization line, and an eroded via is defined between the first lower metallization line and the first upper metallization line. The programmable structure further includes an electrical connection that is defined between a first point on the second upper metallization line and a second point on the first lower metallization line. The electrical connection is capable of forming an electron flow originating at the second point of the first lower metallization line and leading to the first point of the second upper metallization line, such that electron flow causes metallization of the first lower metallization line to flow into the eroded via and form a hard-wired link.

In another embodiment, a method for making a programmable structure in a semiconductor chip is disclosed. The method includes forming a first metallization layer such that it includes a first lower metallization line and a second lower metallization line. The first and second lower metallization lines are configured to be electrically connected or defined as a single line (e.g., 204' of FIG. 3A). Then, a second metallization layer is formed, such that the second metallization layer includes a first upper metallization line and a second upper metallization line. A conductively filled via to electrically connect the second lower metallization line to the second upper metallization line is formed, and an eroded via between the first lower metallization line and the first upper metallization line is formed. The method then includes applying a current between a first point on the second upper metallization line and a second point on the first lower metallization line. The applied current is configured to generate an electron flow originating at the second point of the first lower metallization line and leading to first point of the second upper metallization line, such that electron flow causes metallization of the first lower metallization line to flow into the eroded via to define a hard-wired link. Preferably, the current is applied by way of the chip's bonding pads, either directly or through an on-chip programming circuit. The eroded via is preferably formed by submersing the programmable structure into a basic solution after a plasma etching operation. The submersing is configured to cause a tungsten material in a tungsten plug to become the eroded via.

In yet another embodiment, a method for making a programmable structure in a semiconductor chip is disclosed. The method includes: (a) forming a lower metallization layer; (b) forming an upper metallization layer, the upper metallization layer having a first portion and a second portion; (c) forming an eroded via between the lower metallization layer and the first portion of the upper metallization layer; (d) forming a conductive via between the lower metallization layer and the second portion of the upper metallization layer; and (e) applying a current between the lower metallization layer and the second portion of the upper metallization layer. The current being configured to cause electromigration in the lower metallization layer such that some of the electromigration fills the eroded via between the lower metallization layer and first portion of the upper metallization layer.

It should be appreciated that the programmable structure of the present invention is a very versatile programmable element, in that it does not require more chip area for its integration. The programmable structure is also more reliable since the formed link, when programmed, is essentially a hard-wired link. Additionally, there is no need for special fuse blowing equipment, other than standard chip testing or current applying apparatus. Still another important feature is the ease of fabrication, since fabricating the programmable structures of the present invention does not require special fabrication operations other than those used in the standard fabrication of inter-metal oxide interconnect lines and tungsten plugs.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings. Therefore, like reference numerals designate like structural elements.

DETAILED DESCRIPTION OF THE PREFERRED EMBODIMENTS

An invention for a programmable structure that can be internally programmed to form a hard-wired link, and methods for making the programmable structure are disclosed. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

In accordance with the present invention, a programmable structure which can be efficiently integrated into an integrated circuit chip is disclosed. The structure is preferably defined between interconnect metallization lines of a device. That is, the programmable structure is initially formed by selecting particular tungsten via plugs to be removed to define one or more via holes that no longer have conductive material interconnecting associated upper and lower metallization lines. The vias that were selectively cleaned of tungsten material may then be selected for programming, if desired. For instance, if a an electrical link is desired between metallization lines that could be coupled by the empty via, a programming current can be applied between two points of the metallization layers in order to promote the electromigration of metallization. The electromigration is that of one of the metallization lines that are desired to be electrically linked. The electromigrating metallization of one of the lines will then be caused to flow into the empty via hole, thus forming a hard-wired link. Initially, the following discussion will address the technique for selectively removing tungsten from via holes lying between two metallization lines and then followed by a discussion on the techniques used to cause the electromigration-based programming of the tungsten-removed via holes.

Figure 1:
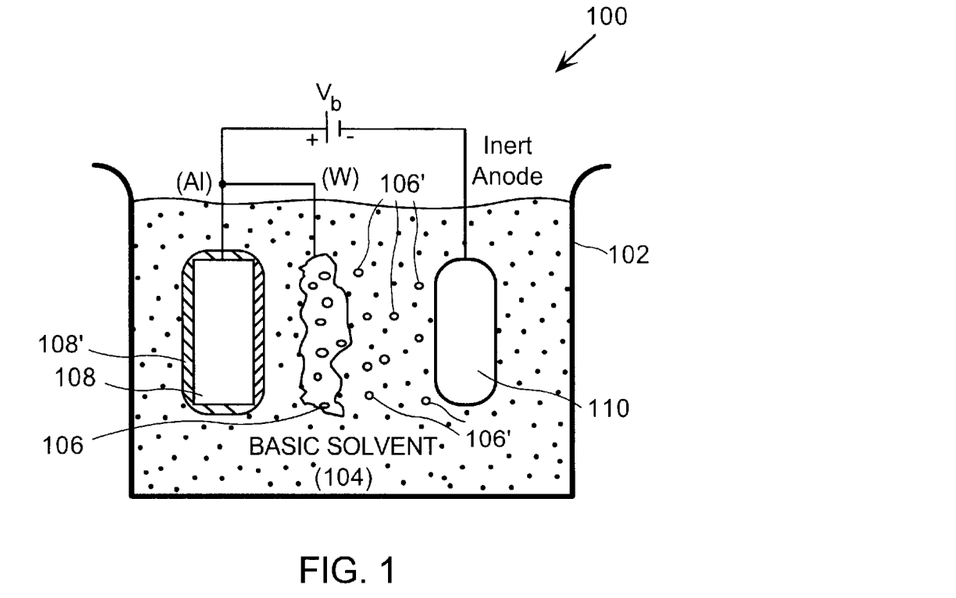
FIG. 1 shows a chemical reaction system having an aluminum electrode and a tungsten electrode submerged in a basic solution in accordance with one embodiment of the present invention.

FIG. 1 shows a chemical reaction system 100 having an aluminum electrode 108 and a tungsten electrode 106 submerged in a basic solution 104 in accordance with one embodiment of the present invention. In this example, both the aluminum electrode 108 and the tungsten electrode 106 are coupled to a positive bias voltage $V_b$, and a negative electrode 110 is coupled to a negative terminal of the bias voltage $V_b$. The basic solvent 104 is preferably an electrolyte that preferably has a pH level that is greater than 7, and more preferably is greater than about 8, and most preferably is greater than about 10.

Although a chemical reaction between the aluminum electrode 108 and the basic solvent 104, and the tungsten electrode 106 and the basic solvent 104 will naturally occur without the application of a bias voltage $V_b$, the chemical reaction in the basic solvent 104 may be accelerated by applying the bias voltage $V_b$. For example, when the bias voltage $V_b$ is applied between the two electrodes, the tungsten electrode 106 will rapidly begin to erode by reacting with the basic solvent 104. This reaction produces tungsten oxide $WO_3$ 106' which rapidly dissolves in lightly basic solutions. Once the reaction begins, the tungsten will continue to oxidize until the tungsten electrode 106 is completely eroded.

In contrast however, the aluminum electrode 108 will not erode in the basic solvent 104, but will form an aluminum oxide passivation layer 108'. Because standard CMOS circuit fabrication processes utilize aluminum interconnect lines and tungsten plugs to interconnect the aluminum lines of the various levels, it is possible to simultaneously manufacture a programmable structure during the standard CMOS circuit fabrication process.

By way of example, when an interconnect layer is designed, a non-filled via of a programmable structure of the present invention may be simultaneously designed into that layer by allowing a portion of a tungsten plug to be exposed, before the semiconductor structure (i.e., the wafer) is submerged into a basic solvent that is commonly used to remove polymers after a metallization etching operation. An embodiment of this technique will now be described in greater detail with reference to FIGS. 2A through 2D.

Figure 2A:
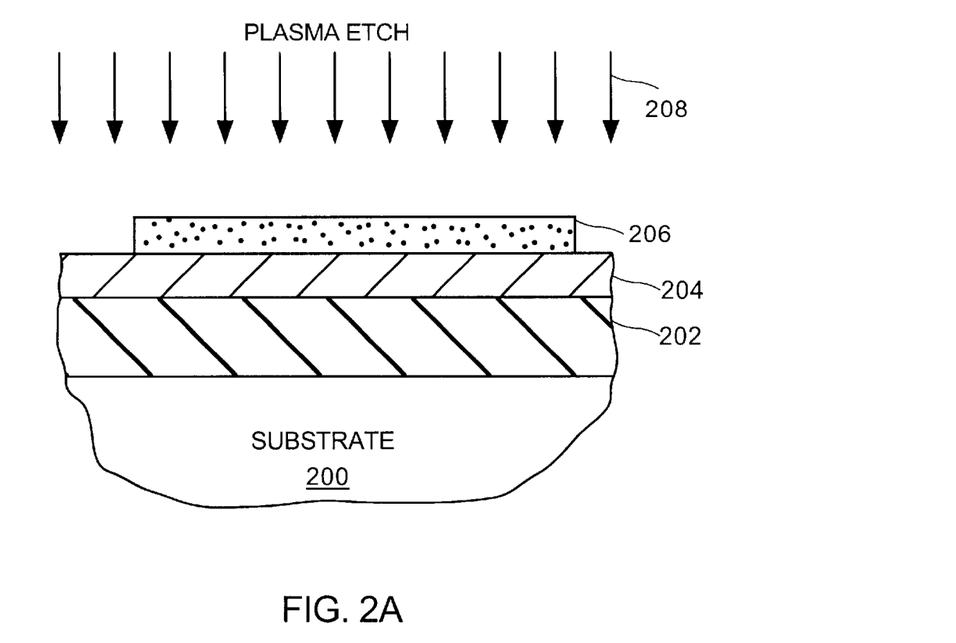
FIG. 2A shows a cross-sectional view of a partially fabricated semiconductor structure that is formed over a substrate in accordance with one embodiment of the present invention.

FIG. 2A shows a cross-sectional view of a partially fabricated semiconductor structure that is formed over a substrate 200 in accordance with one embodiment of the present invention. In an initial operation, an inter-metal oxide 202 is formed over the substrate 200, and then a metallization layer 204 is sputtered over the inter-metal oxide layer 202. In order to pattern the metallization layer 204, a photoresist mask 206 is formed over the metallization layer 204. As is well known, the photoresist mask 206 may be patterned using any number of well known techniques, including conventional photolithography.

Once the photoresist mask 206 has been formed, a plasma etching operation 208 is performed to remove the metallization layer 204 that is not covered by the photoresist mask 206. Although any plasma etcher may be used, one exemplary plasma etcher is a Lam Research TCP 9600 SE etcher, that is available from Lam Research of Fremont, Calif. In this embodiment, the plasma etcher is configured to negatively charge the substrate 200 to a negative potential, and the floating metallization layers that are not electrically connected to the substrate 200 (i.e., through conductive via structures) to a positive potential.

Figure 2B:
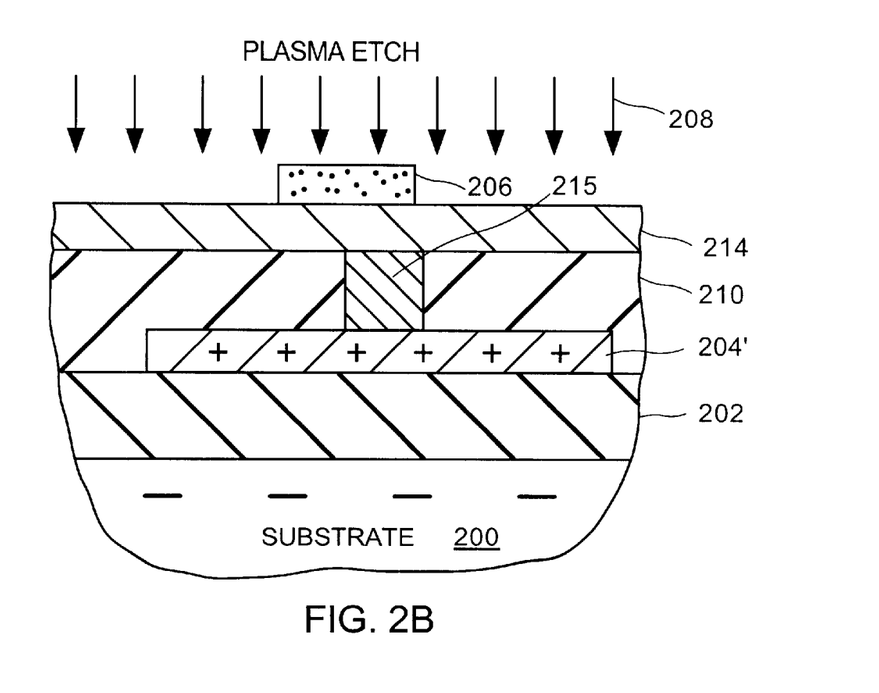
FIG. 2B shows a cross-sectional view of the semiconductor structure of FIG. 3A after a number of layers are fabricated over an inter-metal oxide layer and a patterned metallization layer in accordance with one embodiment of the present invention.
Figure 2C:
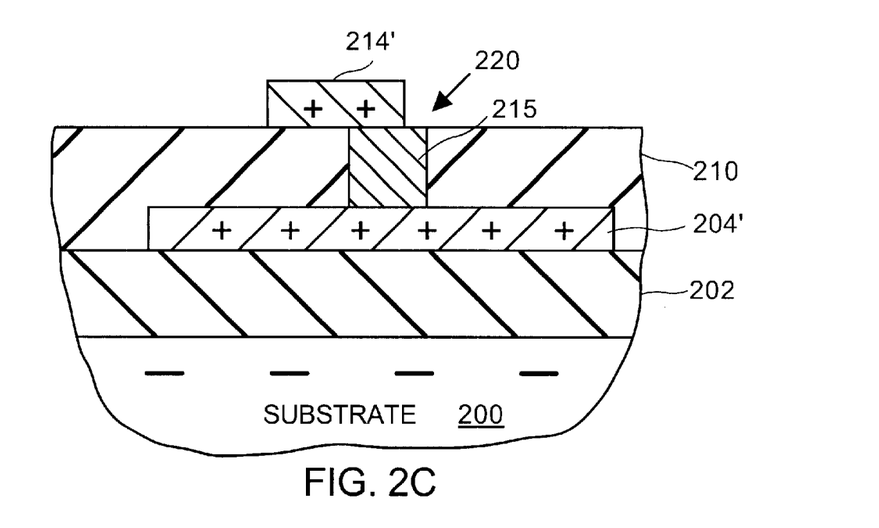
FIG. 2C shows the cross-sectional view of FIG. 2B after a top metallization layer is etched in a plasma etcher in accordance with one embodiment of the present invention.

FIG. 2B shows a cross-sectional view of the semiconductor structure of FIG. 2A after a number of layers are fabricated over the inter-metal oxide layer 202 and a patterned metallization layer 204' in accordance with one embodiment of the present invention. As pictorially shown, the patterned metallization layer 204' was charged to a positive (+) potential, and is a floating structure that is not connected to a diffusion or gate of the substrate 200. In this example, an inter-metal oxide layer 210 was formed over the patterned metallization layer 204', and a tungsten plug 215 was formed within a via that was etched into the inter-metal oxide layer 210.

After the tungsten plug 215 is formed into the inter-metal oxide layer 210, a metallization layer 214 is sputtered over the inter-metal oxide layer 210 and the tungsten plug 215. In order to pattern the metallization layer 214, a photoresist mask 206 is defined over the metallization layer 214. In this embodiment, the photoresist mask 206 is patterned such that at least a portion of the tungsten plug 215 is exposed once the metallization layer 214 is etched. Therefore, once the plasma etch operation 208 is performed, the structure of FIG. 2C will result. As shown, a patterned metallization layer 214' will now lie over the inter-metal oxide layer 210, and over substantially all of the tungsten plug 215. However, at least one gap 220 of any suitable shape will expose a portion of the underlying tungsten plug 215. After the etching operations are complete, a charge "Q" that is equivalent to the capacitance "C" of the patterned metallization layers 204' and 214' multiplied by the induced plasma voltage during the plasma etching of the metal is produced (i.e., Q=C*V).

Figure 2D:
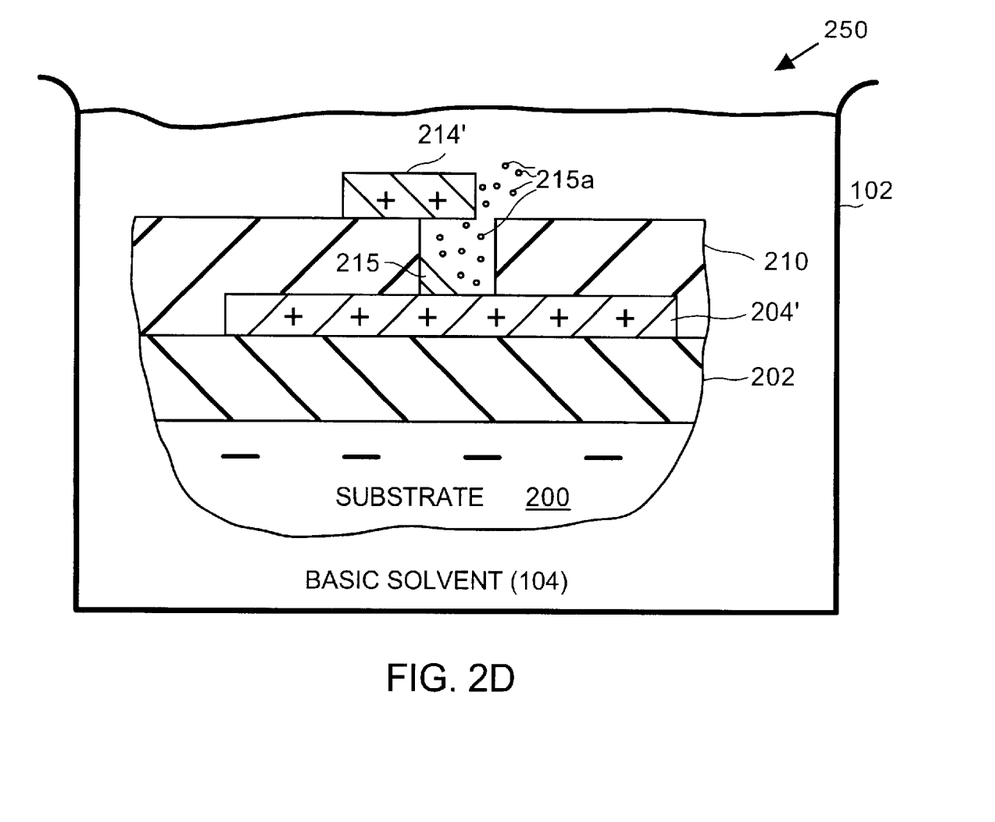
FIG. 2D shows a polymer removal system in which a fabricated substrate is submerged in a basic solvent in accordance with one embodiment of the present invention.

FIG. 2D shows a polymer removal system 250, in which a fabricated substrate 200 is submerged in a basic solvent 104 in accordance with one embodiment of the present invention. Because the fabricated substrate 200 is usually submerged in a container 102 that contains the basic solvent 104 during standard CMOS polymer removal operations, it is advantageously possible to simultaneously fabricate the via hole of the programmable structure during these operations. That is, the polymer removal system 250 is generally used as a standard operation after a plasma operation, and therefore, by strategically patterning metallization materials over selected tungsten plugs, it will be possible to form programmable structures in any desired region of the integrated circuit chip, thus using up less chip area.

Therefore, by ensuring that the via hole desired to be eroded is not electrically connected to the negatively charged substrate 200, and by pattering the overlying metallization to ensure that a gap exposes a tungsten plug to a basic solvent having a pH level that is greater than 7, it is possible to efficiently fabricate the via holes of the programmable structures.

In this example, because the patterned metallization layer 214' and the patterned metallization layer 204' are not in electrical contact with the substrate 200 that is negatively charged, the chemical reaction described with reference to FIG. 1 will naturally occur. That is, the tungsten plug material 215 will immediately begin to erode and be converted to tungsten oxide ions 215a. As a result, the tungsten plug material 215 will be completely removed, thereby creating a clean via hole. In one embodiment, the erosion of the tungsten material will generally occur so long as the charge Q of the metal capacitor divided by $1.6 \times 10^{-19}$ is greater than the number of tungsten atoms in the via plug (i.e., $Q/1.6 \times 10^{-19}$>W atoms in plug). For more information on the formation of voided via holes, reference can be made to U.S. Pat. No. 5,928,968, entitled "Semiconductor Pressure Transducer Structures and Methods for Making the Same," filed on Dec. 22, 1997, and issued on Jul. 27, 1999. This U.S. Patent is hereby incorporated by reference.

Figure 3A:
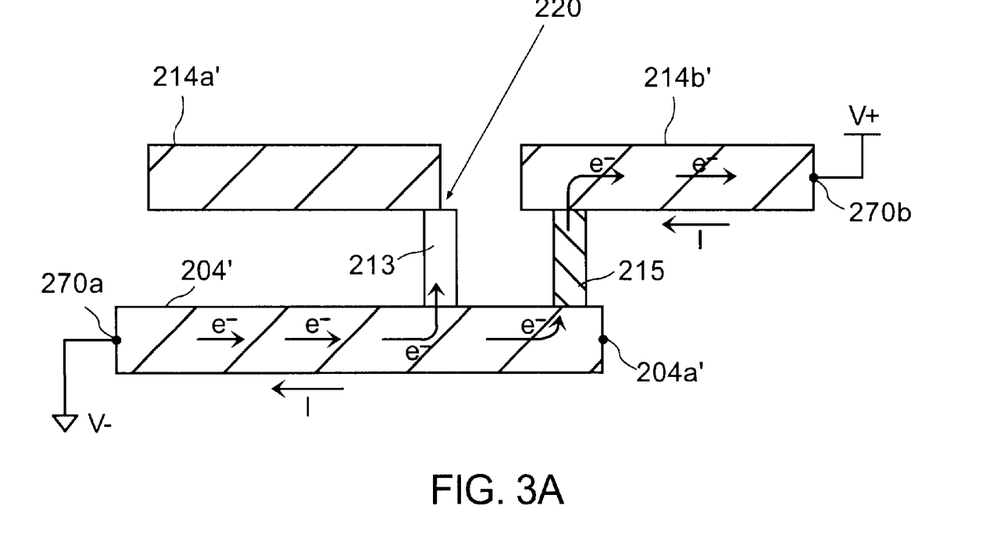
FIG. 3A illustrates a cross-sectional view of a programmable structure, in accordance with one embodiment of the present invention.

FIG. 3A illustrates a cross-sectional view of a programmable structure, in accordance with one embodiment of the present invention. In this illustration, the cross-sectional view only illustrates a pair of metallization lines and vias between them to emphasize that the programmable structure can be define between any two interconnect metallization layers, not just the top metallization as required in traditional fuse structures. Furthermore, the programmable structure can be formed over any region of a chip, even if one or more active devices are formed directly below the programmable structure. As such, the programmable structures of the present invention do not require special additional chip area or need to be spaced apart from active regions.

Discussing FIG. 3A in detail, the lower metallization layer is a patterned metallization layer 204', and the top metallization layer is a patterned metallization layer 214a' and 214b'. Patterned metallization layer 214a' was patterned to leave the exposed gap 220, thus, during the basic solution treatment the tungsten material in the via hole 213 was removed. Accordingly, there is no electrical link at this time between the patterned metallization layer 214a' and the patterned metallization layer 204'. However, the patterned metallization layer 214b' was patterned such that the tungsten plug 215 was covered from the top, and therefore, the tungsten material in the tungsten plug 215 was not eroded when the basic solution treatment was applied.

If programming of the programmable structure is desired, an electrical connection is defined between a point 270a and a point 270b of the patterned metallization lines 204' and 214b', respectively. These electrical connections are, in practice, made by routing different ends of the metallization lines to appropriate locations on the chip where a voltage differential V+/V− can be applied between the points 270. The voltage differential should be configured to cause a current flow and an associated electron flow e−. In this example, due to the way the electrical connections are formed, current flow will occur from point 270b to point 270a. At the same time, the electron flow e− will flow from point 270a to point 270b.

Electromigration is commonly understood to be the result of an average current flow through a conductor. The flowing electrons transfer a fraction of their momentum to the metal atoms from the scattering process. This momentum transfer in turn causes a movement of the metal atoms (i.e., mass transfer) in the direction of electron flow. Therefore, the amount of momentum transfer, and resulting metal flow, increases with increasing current density. As a result, initially the metal flow will move to the end 204a' of the patterned metallization line 204' (i.e., where the tungsten plug 215 resides). When the accumulation of metal atoms increases at that end 204a', the metal flow will be caused to move into the via hole 213. It is believed, however, that at the beginning of the electromigration flow, the metal will also start to move into the via hole 213 due to the fact that the via hole 213 is substantially smaller than the amount of metallization flowing along the patterned metallization line 204'. The preferred separation between the via hole 213 and the tungsten plug 215 is between about 1 micron and about 2 microns. For more information on electromigration, reference can be made to a U.S. patent application No. 09/259,744, entitled "Electromigration Bonding Process and System," filed on Feb. 27, 1999, and having inventor Subhas Bothra. This U.S. Patent Application is hereby incorporated by reference.

Figure 3B:
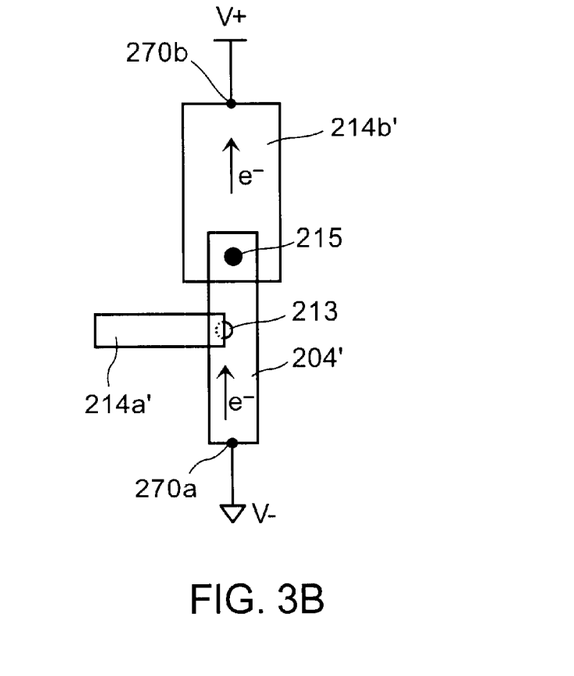
FIG. 3B illustrates a top view of the programmable device, in accordance with one embodiment of the present invention.

FIG. 3B illustrates a top view of the programmable device, in accordance with one embodiment of the present invention. From this view, it can be seen that the via hole/tungsten plug diameters are generally smaller than the width of the interconnect lines.

In one specific example, a typical diameter for a via hole or a tungsten plug is between about 1,500 Angstroms and about 10,000 Angstroms, and most preferably about 2,500 Angstroms. A typical metallization line width can be between about 2,000 Angstroms and about 100,000 Angstroms, and more preferably, between about 4,000 Angstroms and about 50,000 Angstroms, and most preferably about 10,000 Angstroms. The thickness of the metallization lines can between about 2,000 Angstroms and about 50,000 Angstroms, and more preferably between about 4,000 Angstroms and about 20,000 Angstroms, and most preferably about 5,000 Angstroms. It should now be appreciated that the substantially larger volume of electromigrating metal will cause the eroded via hole 213 in the programmable structure to be filled, thus forming a reliable electrical connection.

Still referring to FIG. 3B, it is pictorially illustrated that the electron flow e− is between points 270a and 270b, respectively. Also shown is the gap 220, which at this point is exposing the eroded via hole 213. Although the gap 220 is illustrated to be a slight overlap, any other geometric arrangement can work, so long as the tungsten material is exposed to enable the eroding that partially defines the programmable structure.

Figure 3C:
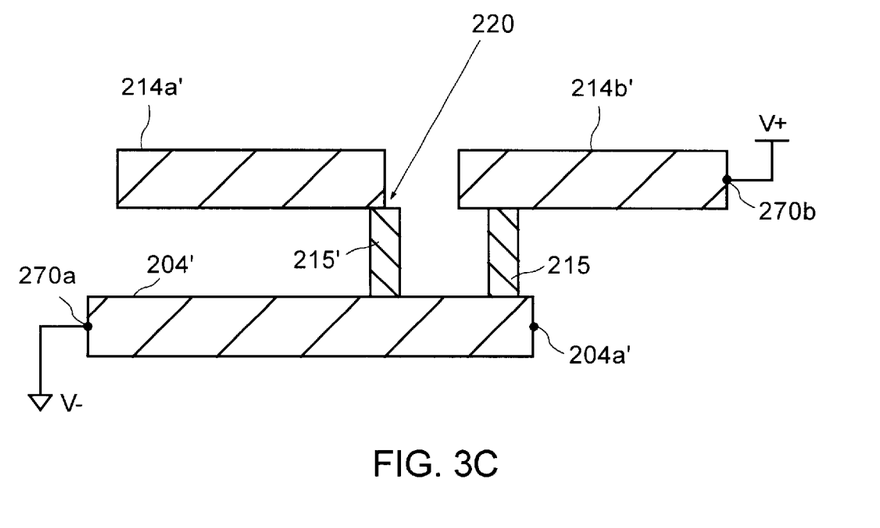
FIG. 3C illustrates the structure of FIGS. 3A and 3B after the programming as occurred, in accordance with one embodiment of the present invention.

FIG. 3C illustrates the structure of FIGS. 3A and 3B after the programming as occurred, in accordance with one embodiment of the present invention. From this illustration, it can be seen that the via hole 213 is now a conductively filled link 215'. This link 215' thus establishes electrical communication between the bottom patterned metallization line 204' and the patterned metallization line 214a'. Because of this link, the patterned metallization line 214b' is in electrical communication with the patterned metallization line 214a'.

Figure 4A:
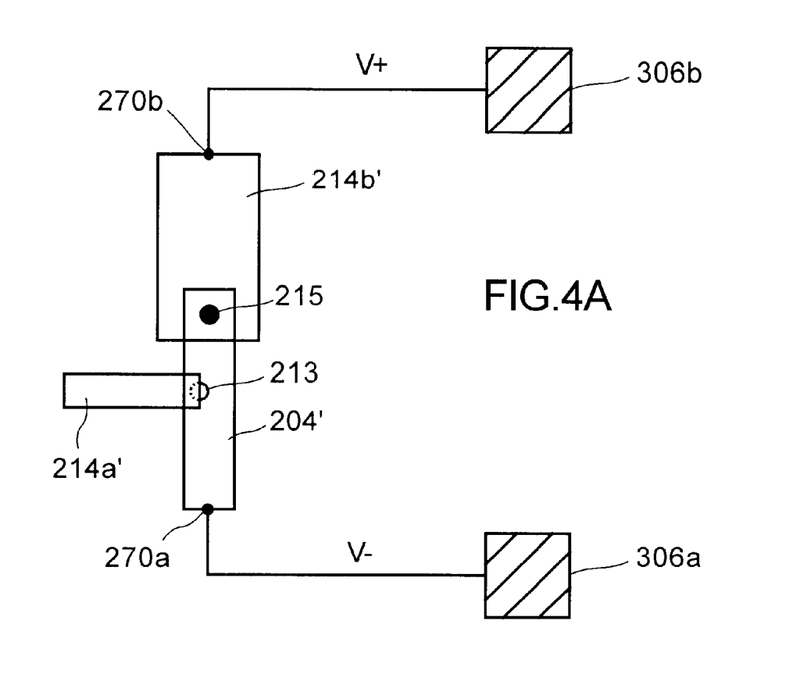
FIGS. 4A and 4B illustrate exemplary techniques for electrically connecting to points of the programmable structure, in accordance with one embodiment of the present invention.
Figure 4B:
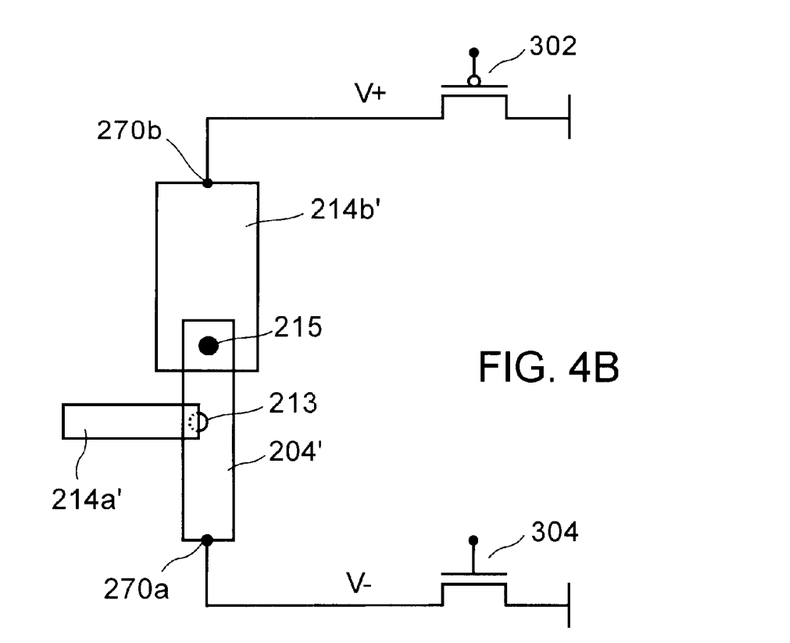

FIGS. 4A and 4B illustrate exemplary techniques for electrically connecting to points 270a and 270b, in accordance with one embodiment of the present invention. In FIG. 4A, it is shown to use pads 306a and 306b to electrically communicate with points 270a and 270b, respectively. The pads 306 of this example, represent wire bonding pads of a semiconductor chip. It is important to note that programming currents can thus be applied to the programmable structure by way of an external source. More specifically, the chip can be completely fabricated and packaged before the programming needs to be performed. In one example, the programming can be done on a programming module that has receptacles for receiving pins of the packaged device. If the package is a ball grid array, the programming can be done through a module that is designed to mate with the solder balls of the package. Still further, if the chip is designed to go into a smart card, an ATM card, or the like, the chip itself can be programmed through the pads themselves with suitable programming electrodes.

This is in contrast to fuse technology that requires a laser to blow conductive material at the top most level of a chip before it is even packaged. Accordingly, the chip can be programmed with any specific code or information depending upon the application. In some cases, manufacturers of electronic devices may want to purchase chips that are not yet programmed, but allow programming at a later time when the programming codes have been finalized. If the devices were programmed before packaging, the manufacturer would have to wait until a future date to place the order for the chips, have them programmed, and then await delivery. In today's electronics market place, such delays would be impractical, and would possibly cause a loss in sales and customers. It should therefore be appreciated that the programming flexibility offered by the structure of this invention empowers end-point manufacturers with the ability to program (i.e., in a hard-wired sense) packaged chips just before they are incorporated into a device.

FIG. 4B illustrates yet another embodiment for applying current to the programmable structure in accordance with the invention. In this example, a pair of transistors 302 and 304 are connected to metallization lines that lead to the points 270a and 270b, respectively. To accomplish the programming, some of the gates of a chip can be implemented with logic to apply a current between the points 270. By doing this, it is not necessary to have dedicated pads 306 for each programmable structure. Thus, the programming is accomplished by way of an internal current source.

Figure 5:
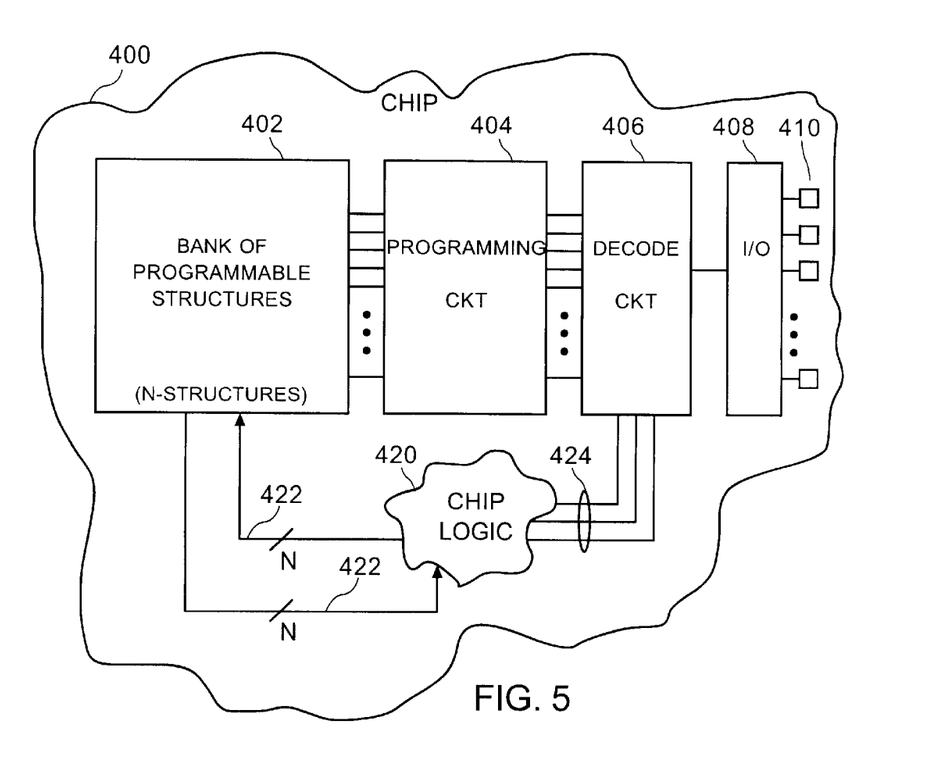
FIG. 5 illustrates yet another embodiment of the present invention, in which a bank of programmable structures is provided in a chip.

FIG. 5 illustrates yet another embodiment of the present invention, in which a bank of programmable structures 402 is provided in a chip 400. For simplicity, the chip in this diagram is shown having chip logic 420, which is configured to carry out the desired application that the chip was manufactured for. The bank of programmable structures 402, in this example, has N structures, which can be set to conduct or remain non-conducting (i.e., if no current is applied to form the link). Coupled to the bank of programmable structures 402 is a programming circuit 404, which can be designed to use certain gates and wiring of the chip 400 do define the programming logic.

To enable programming at one stage, and functional operation after the programming, a simple decode circuit 406 (having multiplexers and associated decode logic) can be designed to either communicate programming signals to the programming circuit 404 or signals to accomplish the functionality of the chip by way of signals 424. The signals 424 are thus passed to the chip logic 420, which uses the programmed state of the bank of programmable structures 402 by way of communication lines 422. For completeness, the pads 410 are also shown communicating to a standard I/O block 408, which is typically configured to interface between the signals supplied to the pads 410 and the signals supplied to the chip 400.

Figure 6:
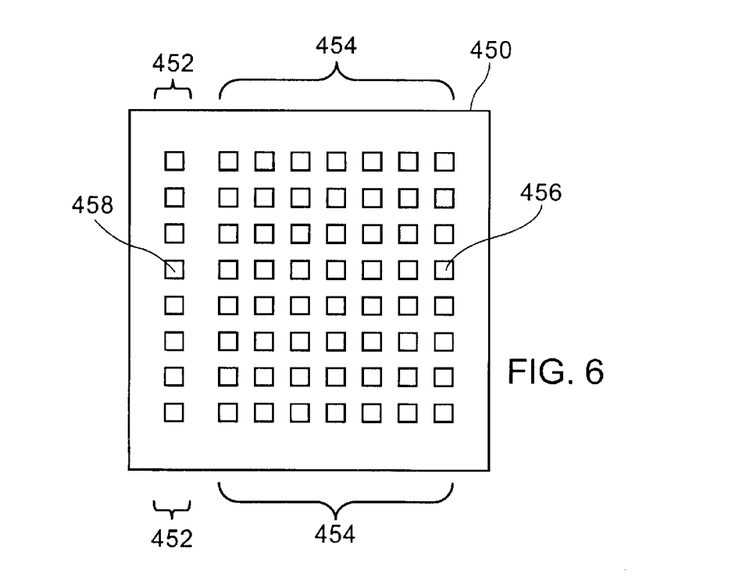
FIG. 6 shows yet another embodiment of the present invention, in which the programmable structures are implemented in memory cell arrays.

FIG. 6 shows yet another embodiment of the present invention. Because the programmable structures can be programmed from external pads 410 (not shown in FIG. 6), it is possible to integrate this programmable structure into standard gate array logic. Typical array logic 454 is used in memory devices 450, wherein the memory cells 456 are arranged in rows and columns. When such memory devices are tested, it is often realized that some of the devices do not work and thus have to be replaced with a redundant cell from a bank of redundant cells 452. As described above in detail, standard technologies use fuses that are blown to enable the replacement of one of the cells 456 with one of the redundant cells 458. Because the programmable structures of the present invention can be placed anywhere over any active device, it is possible to replace fuse technology with the structures of the present invention.

Again, it is noted that the structures can be formed between any two metallization layers in a chip, and thus do not require additional chip area. In addition, the formed links are more reliable than conventional fuse technology because the links actually represent hard-wired connections. In antifuse technology for example, formed links are not hard-wired links, and thus can become deprogrammed over time.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A programmable structure, comprising:
   a first lower metallization line defined on a first metallization layer;
   a second lower metallization line defined on the first metallization layer, the first and second lower metallization lines being electrically connected;
   a first upper metallization line defined on a second metallization layer;
   a second upper metallization line defined on the second metallization layer;
   a conductively filled via electrically connecting the second lower metallization line to the second upper metallization line;
   an eroded via defined between the first lower metallization line and the first upper metallization line; and
   an electrical connection being defined between a first point on the second upper metallization line and a second point on the first lower metallization line, the electrical connection being capable of forming an electron flow originating at the second point of the first lower metallization line and leading to the first point of the second upper metallization line, such that electron flow causes metallization of the first lower metallization line to flow into the eroded via and form a hard-wired link.

2. A programmable structure as recited in claim 1, wherein the first upper metallization line at least partially exposes the eroded via, the partial exposure defines a gap.

3. A programmable structure as recited in claim 1, wherein the first lower metallization line is coupled to a pad of a chip having the programmable structure.

4. A programmable structure as recited in claim 1, wherein the second upper metallization line is coupled to a pad of a chip having the programmable structure.

5. A programmable structure as recited in claim 1, further comprising:
   a programming circuit, the programming circuit having logic for programming the programmable structure.

6. A programmable structure as recited in claim 5, wherein the logic of the programming circuit is coupled to pads of a chip that incorporates the programmable structure.

7. A programmable structure as recited in claim 1, wherein the programming structure is integrated into one of an identification card chip, a bank card chip, a memory array chip, a security access chip, and a communications device chip.

8. A programmable structure as recited in claim 6, wherein the chip incorporates a decoding circuit for decoding between programming signals and functional signals.

9. A programmable structure as recited in claim 1, wherein the programmable structure is formed over active and passive devices of a chip that incorporates the programmable structure.

10. A programmable structure as recited in claim 1, wherein the chip is embodied in a package, and the programmable structure is programmable from connections of the package.

11. A programmable structure as recited in claim 1, wherein the programmable structure is replicated into a bank of programmable structures, each of the programmable structures being programmed through a programming circuit having programming logic, and the programming logic is in communication with at least one pad of a chip that embodies the bank of programmable structures.

* * * * *